(12) United States Patent
Feldman

(10) Patent No.: US 6,246,477 B1
(45) Date of Patent: Jun. 12, 2001

(54) HIGH RESOLUTION SCANNING MICROSCOPE

(75) Inventor: Martin Feldman, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 0 days.

(21) Appl. No.: 09/293,017

(22) Filed: Apr. 16, 1999

Related U.S. Application Data
(60) Provisional application No. 60/135,112, filed on Apr. 22, 1998.

(51) Int. Cl.$^7$ .................................................. G01B 11/14
(52) U.S. Cl. ........................................... 356/375; 250/234
(58) Field of Search .................... 356/432, 520, 356/359; 359/370; 250/234

(56) References Cited

U.S. PATENT DOCUMENTS

| | | | |
|---|---|---|---|
| 5,086,222 | * 2/1992 | Shibuya | 359/370 |
| 5,459,576 | * 10/1995 | Brunfeld et al. | 356/353 |
| 5,561,515 | * 10/1996 | Hairston et al. | 356/336 |
| 5,638,175 | * 6/1997 | Brunfeld et al. | 359/370 |
| 6,020,963 | * 2/2000 | DiMarzio | 356/351 |

OTHER PUBLICATIONS

Feldman, M. et al., "High–resolution Scanning Microdensitometer," Rev. Sci. Instrum., vol. 68, pp. 3112–3115 (1997).

Levenson, M. et al., "Improving Resolution in Photolithography with a Phase–Shifting Mask," IEEE Trans. Electron Dev., vol. ED–29, pp. 1828–1836 (1982).

* cited by examiner

Primary Examiner—Hoa Q. Pham
(74) Attorney, Agent, or Firm—John H. Runnels

(57) ABSTRACT

A scanning microscope is disclosed that uses an optical phase shift technique for high optical resolution, without reducing either the depth of focus or the working distance. The technique minimizes, for example, error in the location of edges of features on lithographic masks or wafers. The technique also permits the accurate determination of edges on features that would otherwise be too narrow to be measured. The microscope is useful in any field where optical microscopes are employed, including for example both semiconductor and biological applications. It is also useful in optical data storage applications. In addition, a small numerical aperture in the optical system allows a high depth of focus, while maintaining the resolution. The microscopes use standard components to produce high intensity images with large working distances and large depths of focus, without substantial mechanical complexity.

34 Claims, 5 Drawing Sheets

HIGH RESOLUTION SCANNING MICROSCOPE

The benefit of the Apr. 22, 1998 filing date of provisional application 60/135,112 is claimed under 35 U.S.C. § 119(e).

This invention pertains to optical microscopes, particularly to scanning optical microscopes.

During the last few years several techniques have been developed to enhance the resolution of optical microscopes. These techniques include confocal microscopes, which are now commercially available, and which improve resolution by a factor of about 2½, and near field microscopes, which have a resolution of about λ/10, but which have a low light level and a working distance much less than 1 μm. Although such microscopes have applications in biology, to a large extent these recent efforts have been driven by the integrated circuit industry, which has a need to measure small features on masks and wafers. A device commonly used to locate the edges and hence to measure the widths and locations of features on masks and wafers is the linearly scanned microdensitometer. Such microdensitometers are frequently designed to have reduced resolution in the direction perpendicular to the scan, for example by passing the image through a slit or by averaging several consecutive video scan lines. The edges may be located by comparing the video signal to a predetermined threshold, or by more extensive image processing. As minimum feature sizes, especially on wafers, have dropped into the submicron range, accurate optical measurements have become increasingly challenging. Features near or below the limits of optical resolution do not produce fully modulated video signals, significantly compromising the accurate determination of edge locations. This problem is particularly serious on wafers where, in addition to small feature size, uncontrolled variations in feature contrast may preclude knowledge of the absolute signal levels. Moreover, the height of the features being measured may exceed the depth of focus of the optical system used to generate the video signal.

M. Levenson et al., "Improving Resolution in Photolithography with a Phase-Shifting Mask," *IEEE Trans. Electron. Dev.*, vol. ED-29, pp. 1828–1836 (1982) is representative of prior papers disclosing a phase shift plate to alter the phase of transmitted light. There was no suggestion to use such a device as part of a microscope.

I have discovered a scanning optical microscope that uses an optical phase shift technique to improve optical resolution by a factor of about two compared to conventional light microscopes, without reducing either the depth of focus or the working distance. The novel technique reduces, for example, error in the location of edges of features on lithographic masks or wafers. The technique also permits the accurate determination of edges on features that would otherwise be too narrow to be measured. The novel microscope is useful in any field where optical microscopes are employed, including for example both semiconductor and biological applications. It is also useful in optical data storage applications, where it could be used to increase the amount of data stored per unit area by a factor between about 2 and about 4. In addition, by reducing the numerical aperture of the optical system, the depth of focus may be extended by a factor of four in comparison to a conventional optical system, while maintaining the resolution. The new microscopes use standard components to produce high intensity images, with large working distances and large depths of focus, without substantial mechanical complexity.

BRIEF DESCRIPTION OF THE DRAWINGS

One embodiment of the novel microscope uses a phase shift plate with a change in thickness to induce a 180 degree discontinuity in the phase of transmitted light. As illustrated in FIG. 1(a), a single step of appropriate dimension is used, a dimension that is a simple function of the refractive index of the plate and the wavelength of transmitted light. The height of this step is chosen to cause a 180 degree phase discontinuity in light transmitted across the step. For example, the height of the step for a 180° phase shift may be equal to $\lambda/2(n-1)$, where λ is the wavelength of the light, and n is the refractive index of the material. (Appropriate heights for phase shifts other than 180° would be adjusted proportionately. Phase shifts other than 180° are used, for example, in the two-dimensional phase shift zone described below.) If light transmitted through the phase shift plate is imaged, the amplitude of the light in the image plane changes sign, passing through zero at the point corresponding to the step (FIG. 1(b)), which will sometimes be called the "image point" for reasons that will become apparent. The intensity of the imaged light, which is the square of the amplitude, is also zero at the image point (FIG. 1(c)). For diffraction limited (or nearly diffraction limited) optics, the width of the dark area containing the image point is about half the nominal resolution of the imaging system.

In a conventional scanning microdensitometer, a focused line or spot is scanned across a feature of interest, and the transmitted or reflected light is detected as a function of the position of the scan. In principle, a phase shift plate could be used to generate a very narrow dark line. This dark line could then be scanned across a feature and the transmitted or reflected light detected in the conventional method. Unfortunately, this method would have practical difficulties, because the "dark signal" would be a very small fraction of the total light intensity, and would therefore be severely degraded by any noise or nonuniformity in the illumination.

FIG. 2 illustrates one embodiment of a preferred method. A plane-polarized "phase shift" laser beam illuminates the phase shift plate and is focused in the image plane (FIG. 2(a)). The resulting intensity distribution at the image plane has a narrow, dark center (FIG. 2(b)). A second, orthogonally polarized "reference" laser beam forms an image of a slit at the same position in the image plane (FIG. 2(c)). The width of the slit is adjusted so that the intensity distribution of the reference beam matches the intensity distribution of the first beam as closely as possible, except that the second beam lacks the narrow, dark center. The two beams are separately detected, and the signal generated by the phase shift beam is subtracted from the signal generated by the reference beam (FIG. 2(d)). This difference signal is equivalent to the signal that would be produced by a hypothetical single beam whose width were equal to that of the narrow, dark center in the first beam. The two beams are then simultaneously scanned across a specimen placed in the image plane to produce the microdensitometer signal.

Note that only linear operations on observed optical signals are used to improve the observed "rise-time" attributable to a feature such as an edge. By contrast it would, for example, be possible to improve the rise-time of a signal by amplifying it into saturation. However, such a procedure would not permit a more accurate location of the feature edge. The procedure of the present invention maintains the correlation between the rise of the signal and the location of the edge, permitting higher accuracy than can be obtained with prior optical techniques.

Figure 3:
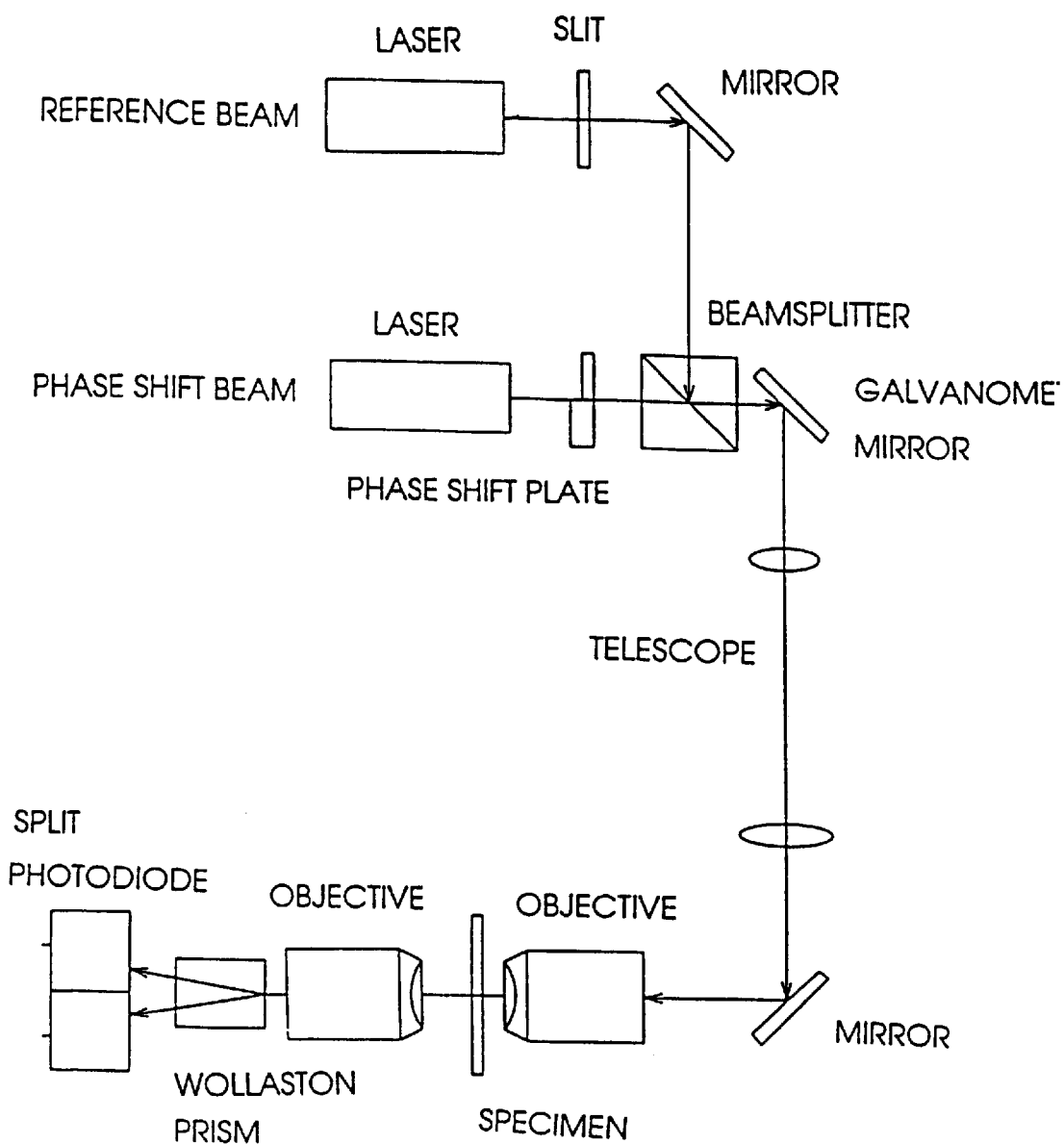
FIG. 3 illustrates schematically a prototype embodiment of the present invention.

Experimental apparatus used in a prototype embodiment of this invention is illustrated in FIG. 3. Light was obtained from two orthogonally polarized $TEM_{00}$ HeNe laser beams at 6328 Å. The "phase shift" beam passed through a 180 degree phase-shift plate fabricated in photoresist on a microscope slide through standard lithography means. The "reference" beam passed through an adjustable slit. The beams were combined in a polarizing beam splitter, and were simultaneously scanned by a galvanometer (General Scanning G 10B galvanometer, General Scanning Inc., 500 Arsenal St., Watertown, Mass. 02172). A telescope imaged light from the galvanometer mirror into the entrance aperture of the first microscope objective. The most powerful objective we have used to date has been a 50x extra long working distance objective with a numerical aperture ("NA") of 0.55. (Olympus ULWD MS Plan 50x microscope objective, Olympus America Inc., Two Corporate Center Dr., Melville, N.Y. 11747) The telescope expanded the beams so that they filled the apertures of the microscope objectives, and provided the parallel light required by the 50x objective, which was infinity corrected. The specimen was formed of chrome on a glass mask, containing features a few microns wide. Light passing through the specimen was collected with a second, 10x microscope objective (Nikon M10 Plan 0.25 NA microscope objective, Nikon Inc., 1300 Walt Whitman Rd., Melville, N.Y. 11747), passed through a Wollaston prism to separate the two polarizations, and imaged on a split photodiode. (UDT PIN SPOT/2D split photodiode, UDT Sensors Inc., 12525 Chadron Ave., Hawthorne, Calif. 90250) The two signals were then subtracted, and viewed on an oscilloscope.

The performance of this prototype embodiment was first evaluated with a gaussian laser beam, obtained by moving the phase shift plate so that the "phase shift" beam did not pass through the step in the phase shift plate, but leaving the rest of the optical system undisturbed. The rise-times (defined as the distance between 10% and 90% of the total change in intensity) were measured for various microscope objectives (Table I). The results with the 50x objective showed that it was nearly diffraction limited. Similar results were obtained with the other objectives.

The effect of phase shifting was then evaluated by subtracting the signal generated by the phase shift beam from the signal generated by the reference beam (Table I). The shapes of the waveforms that were obtained could be adjusted by changing the relative strengths of the two signals. An "overshoot" of about 20% to 25% was generally a good compromise between minimizing the rise-time of the signal, and minimizing "ringing." Oscilloscope traces (not illustrated), as both the gaussian beam and the subtracted phase shift beam were scanned across a feature edge, showed an improvement in resolution by approximately a factor of two in the 10% to 90% rise-time of the signals for all three objectives. (Table I). This improvement was also evident in a video display (not illustrated) obtained by using the signals to modulate the intensity of an oscilloscope beam scanned in two dimensions.

TABLE I

Experimentally observed rise-times as light was scanned across a feature edge, for three different microscope objectives with different NA's. The quantity $\lambda/2NA$ is often taken as the diffraction limited resolution, and is shown for comparison. The column labeled "Ratio" shows the Phase Shifted rise-time divided by the Gaussian beam rise-time, and is a measure of the increased resolution.

| Magnification | NA | $\lambda/2NA$ | Gaussian | Phase Shifted | Ratio |
| --- | --- | --- | --- | --- | --- |
| 5X | 0.05 | 6.32 μm | 6.5 μm | 3.2 μm | 0.49 |
| 10X | 0.25 | 1.27 μm | 1.5 μm | 0.75 μm | 0.50 |
| 50X | 0.55 | 0.58 μm | 0.65 μm | 0.33 μm | 0.51 |

The laser beams may be scanned in two directions to obtain two-dimensional images. If a single phase-shift plate were used, such as is illustrated in FIG. 1(a), the resolution in one direction would be the same as that of a conventional microscope, while it would be enhanced by a factor of two in the orthogonal direction.

Figure 1A:
FIG. 1(a) illustrates a 180° phase shift plate.

Enhanced resolution in both directions may be obtained by using different, novel forms of phase-shift plates, which will be called "phase shift zones." Instead of a single step as shown in FIG. 1(a), the light beam is passed through a pattern approximating a spiral staircase, or even forming a continuous, 360° ramping spiral (discussed-further below). A narrow dark spot in the center of the image results, as compared to a narrow dark line for a phase shift plate as illustrated in FIG. 1(a). The principal behind two-dimensional imaging with a dark, narrow spot is otherwise analogous to that behind one-dimensional imaging with a dark, narrow line.

Two galvanometers (or other scanning devices) then scan an image in orthogonal directions to generate a two-dimensional image of the specimen. The two beams are, for example circularly polarized in opposite directions (to facilitate later separation), are coaxially focused on the specimen, and are then separately detected with a split photodiode.

Figure 4:
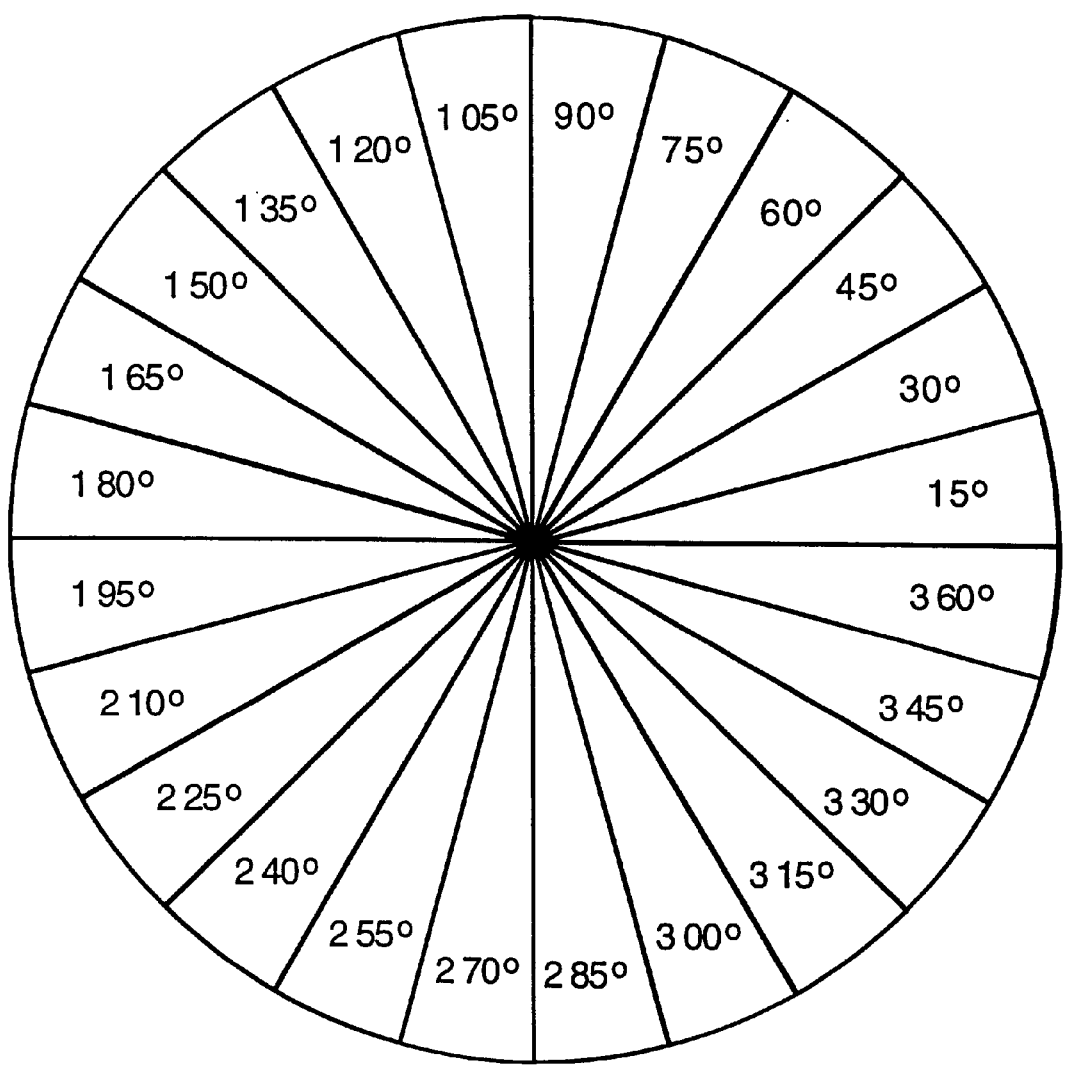
FIG. 4 illustrates a twenty-four-step approximation of the spiral ramp phase shift zone of one embodiment of this invention.

The ideal pattern for such a two-dimensional phase shift zone would be a spiral ramp, passing through 360° around the center spot. The dimensions of the spiral ramp are such that there is a 180° phase shift in traversing the center spot in a straight line in any direction. The phase shift at any point on the spiral is numerically equal to the angle (in the horizontal plane) between a line from that point to the center spot, and a line from the center spot to an arbitrary "x-axis." An approximation is illustrated in vertical view in FIG. 4, in which each 15° "slice" of the "pie" represents a phase shift of 15° as compared to the 15° "slice" before it. Thus passing in a complete circle around the center brings one through a total phase shift of 360°, i.e., no net phase shift.

Because passing through the center spot in any direction corresponds to a phase shift of 180°, the intensity of transmitted light at the center spot is zero, i.e., it forms a two-dimensional dark spot in an otherwise bright field.

A spiral ramp may be approximated by an n-step staircase, where n is at least 3, and may, for example, be 4, 10, 24, or greater. For reasons of efficiency of manufacture that will become apparent below, n is preferably a power of 2 (e.g., 4, 8, 16, 32, etc.). Each of the steps in the staircase is formed of a material having a characteristic optical thickness for photons of a characteristic wavelength. The steps are arranged radially around a center point corresponding to the dark spot, with each said step occupying an angle equal to approximately 360°/n of a hypothetical circle centered on the center point. The optical thickness of the steps varies such that, compared to the phase of light of the characteristic wavelength transmitted through the first step, the phase of the same light transmitted through the mth step is approximately (m=1)×360°/n greater, where $1 \leq m \leq n$.

Figure 1B:
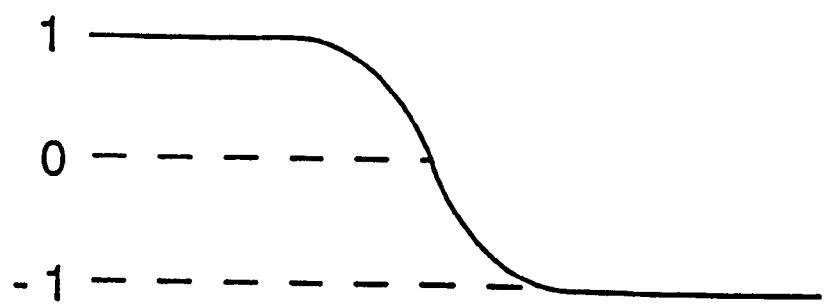
FIG. 1(b) illustrates the amplitude of light transmitted through the phase shift plate of FIG. 1(a).
Figure 1C:
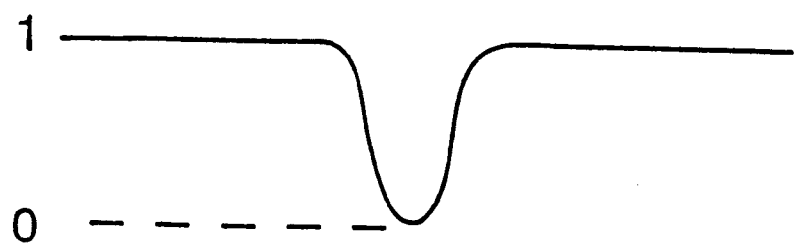
FIG. 1(c) illustrates the intensity of light transmitted through the phase shift plate of FIG. 1(a).
Figure 2A:
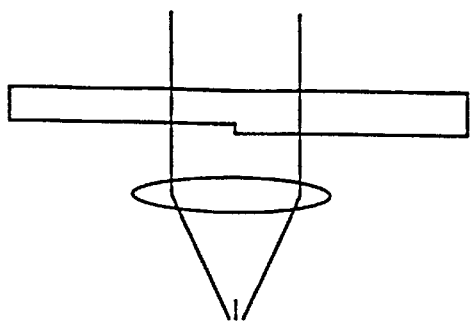
FIG. 2(a) illustrates a coherent laser beam transmitted though a phase shift plate and focused.
Figure 2B:
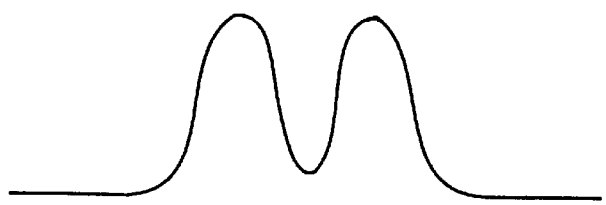
FIG. 2(b) illustrates the intensity distribution of the light from the configuration of FIG. 2(a).
Figure 2C:
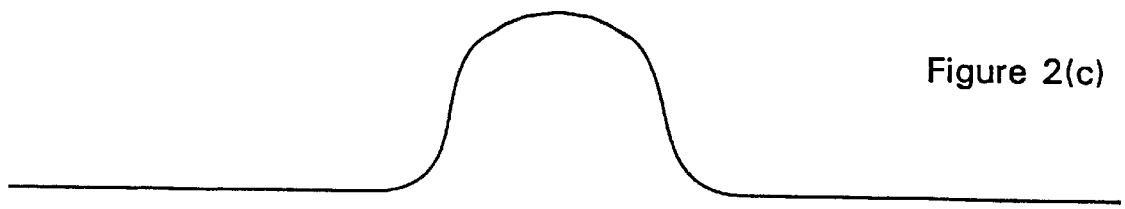
FIG. 2(c) illustrates a reference beam having approximately the same intensity distribution as that shown in FIG. 2(b), but without the narrow, dark center.
Figure 2D:
FIG. 2(d) illustrates the result of subtracting the intensity distribution of FIG. 2(b) from that of FIG. 2(c), producing the equivalent of a narrow, bright line.
Figure 5:
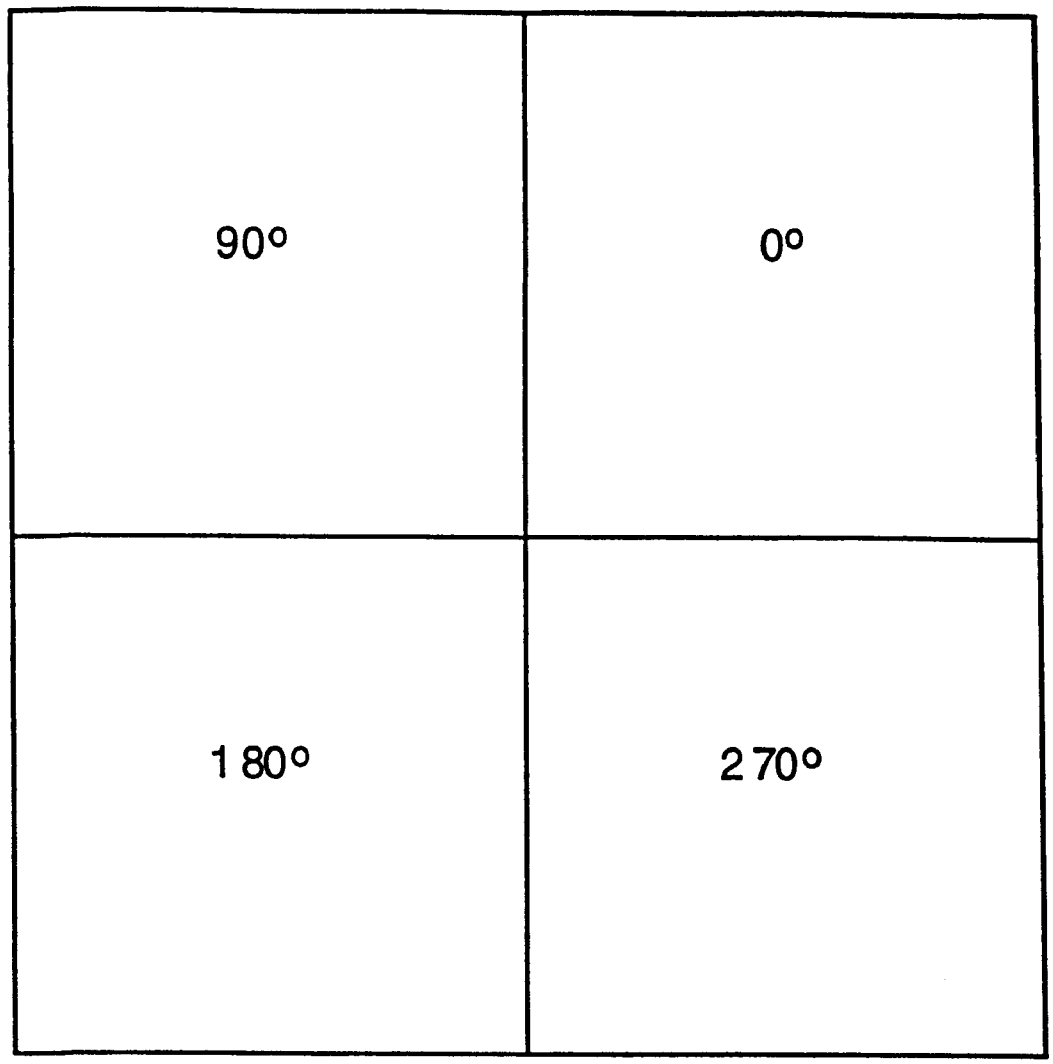
FIG. 5 illustrates a four-step approximation to the spiral ramp phase shift zone.

A four-step approximation to the spiral ramp, illustrated in FIG. 5, has been constructed, and has been successfully used to image a narrow dark spot in the center of a bright field of laser light (not illustrated). The width of the dark spot was about the same as the width of the dark line created with the phase shift plate of FIG. 1.

The four-step staircase was constructed through standard lithography techniques using two masks. Referring to FIG. 5, a first mask was used to build a 180° phase shift in both lower quadrants; and a second mask was used to add an additional 90° phase shift in the upper left and lower right quadrants. The result, as shown in FIG. 5, was a four step staircase with a 0° phase shift in the upper right quadrant; a 90° phase shift in the upper left quadrant; a 180° phase shift in the lower left quadrant; and a 270° phase shift in the lower right quadrant. Note in FIG. 5 that passing through the center in a straight line in any direction corresponds to a 180° phase shift (e.g., 270°−90°=180°).

Analogously, a worker of ordinary skill in the art, given the teachings of the present specification, will readily be able to approximate a smooth spiral ramp with a staircase having $2^k$ steps, each of phase shift $360°/2^k$ as compared to the neighboring steps, by standard lithographic means—using k lithography masks and a total of k exposures of a resist. E.g., a spiral with 32 steps, each step inducing a phase shift of 11.25° compared to its neighboring steps, could be manufactured with only 5 masks and 5 exposure steps.

While a monochromatic light source is preferred for some applications, e.g., locating edges on an integrated circuit, non-monochromtic light—even white light—is preferred in other applications, e.g., many biological microscopy applications. While a single phase shift plate or phase shift zone cannot produce a phase shift of exactly 180° over a range of different wavelengths, a single plate or zone that is optimized for a 180° phase shift at a wavelength lying in the middle of the range can, for many purposes, be adequate over the entire range. For example, a phase shift plate or zone that produces a phase shift of exactly 180° at a wavelength of 550 nm will also produce an adequate dark line (or dark spot) over a range of wavelengths from about 450 to about 650 nm. The total spread of the light beam should be small to maximize the signal-to-noise ratio. When white light is used, some resolution is sacrificed in return for obtaining an image across a range of wavelengths. Alternatively, scans could be made with several monochromatic light sources of different wavelengths, each with its own optimized phase shift plate or phase shift zone.

An alternative (though not preferred) embodiment of the invention eliminates the phase shift plate or zone, and instead uses two coaxial Gaussian laser beams of different width. By subtracting the measured intensity of one from the other, one has an alternative means of generating an effective narrow dark (or bright) spot with which to scan a specimen.

In lieu of, or in addition to, adjustments in height, desired phase shifts may also be induced by other means, for example, using materials of differing refractive index, varying the phase of a diffractive grating, etc. The phase of light transmitted through a material is determined by what will be generically called the "optical thickness" of the material, which takes into account all parameters of the material affecting the phase of transmitted light: physical thickness, refractive index, phase shift of any diffraction grating, etc.

The present technique may be implemented by detecting the intensity of light transmitted through a feature, or by detecting the intensity of light reflected from a feature.

The complete disclosures of all references cited in this specification are hereby incorporated by reference. Also incorporated by reference is the complete disclosure of the following paper, which is not prior art to the present invention: M. Feldman et al., "High-resolution Scanning Microdensitometer," *Rev. Sci. Instrum.,* vol. 68, pp. 3112–3115 (1997). In the event of an otherwise irreconcilable conflict, however, the present specification shall control.

I claim:

1. A method for detecting a microscopic feature, comprising:
   (a) generating a first light beam;
   (b) transmitting the first light beam through a phase shift plate; wherein the phase shift plate comprises a step that induces a phase change of approximately 180° in the photons of the first beam transmitted on opposite sides of the step; whereby the intensity of the transmitted first beam contains a dark line corresponding to the location of the step;
   (c) scanning the transmitted first beam with the dark line across the feature, and detecting the intensity of light thereby transmitted through or reflected by the feature;
   (d) generating a second light beam; wherein the intensity distribution of photons in the second beam is approximately the same as the intensity distribution of photons in the transmitted first beam, but without the dark line of the transmitted first beam;
   (e) scanning the second beam across the feature, and detecting the intensity of light thereby transmitted through or reflected by the feature;
   (f) subtracting the detected intensity of the first beam from the detected intensity of the second beam; whereby the difference between the two intensities approximately equals the intensity that would have been detected from a hypothetical light beam whose width corresponded to the width of the dark line in the transmitted first beam; and
   (g) observing changes in the difference between the two intensities as the first and second beams are scanned across the feature, whereby changes in the difference are an indication of the presence and location of the feature.

2. A method as recited in claim 1, wherein each of said light beams is a coherent laser beam.

3. A method as recited in claim 1, wherein each of said light beams is monochromatic.

4. A method as recited in claim 1, wherein each of said light beams is monochromatic and has the same wavelength.

5. A method as recited in claim 1, wherein each of said light beams includes wavelengths in the range from about 450 nm to about 650 nm.

6. A method as recited in claim 1, wherein the feature is a feature on an integrated circuit or other microdevice.

7. A method as recited in claim 1, wherein said scanning is conducted along one dimension.

8. A method as recited in claim 1, wherein said scanning is conducted along two dimensions.

9. A method as recited in claim 8, wherein a plurality of features are detected by said observing, and additionally comprising displaying an image of the features detected.

10. A method as recited in claim 9, wherein said features are features of a biological specimen.

11. A method for detecting a microscopic feature, comprising:

(a) generating a first light beam having a characteristic wavelength;

(b) transmitting the first light beam through a phase shift zone; wherein the phase shift zone induces a phase change of approximately 180° in the photons of the first beam transmitted on opposite sides of the center point; whereby the intensity of the transmitted first beam contains a dark spot corresponding to the location of the center point; wherein the phase shift zone generates a dark spot in the first light beam when the first light beam is transmitted through the phase shift zone; and wherein the phase shift zone comprises a plurality n of at least three steps; wherein:

(i) each of the steps has a characteristic optical thickness for transmitting photons of the characteristic wavelength;

(ii) the steps are arranged radially around a center point corresponding to the dark spot, with each step occupying an angle equal to approximately 360°/n of a hypothetical circle centered on the center point; such that the first step is adjacent to the second step and to the nth said step, the second step is adjacent to the first step and to the third step, and so forth, and the nth step is adjacent to the (n−1)st step and to the first step;

(iii) the optical thickness of the steps varies such that, compared to the phase of light of the characteristic wavelength transmitted through the first step, the phase of the same light transmitted through the mth step is approximately (m−1)×360°/n greater, wherein $1 \leq m \leq n$;

(c) scanning the transmitted first beam with the dark spot across the feature, and detecting the intensity of light thereby transmitted through or reflected by the feature;

(d) generating a second light beam; wherein the intensity distribution of photons in the second beam is approximately the same as the intensity distribution of photons in the transmitted first beam, but without the dark spot of the transmitted first beam;

(e) scanning the second beam across the feature, and detecting the intensity of light thereby transmitted through or reflected by the feature;

(f) subtracting the detected intensity of the first beam from the detected intensity of the second beam; whereby the difference between the two intensities approximately equals the intensity that would have been detected from a hypothetical light beam whose width corresponded to the width of the dark spot in the transmitted first beam; and (g) observing changes in the difference between the two intensities as the first and second beams are scanned across the feature, whereby changes in the difference are an indication of the presence and location of the feature.

12. A method as recited in claim 11, wherein each of said light beams is a coherent laser beam.

13. A method as recited in claim 11, wherein each of said light beams is monochromatic.

14. A method as recited in claim 11, wherein each of said light beams is monochromatic and has the same wavelength.

15. A method as recited in claim 11, wherein each of said light beams includes wavelengths in the range from about 450 nm to about 650 nm.

16. A method as recited in claim 11, wherein the feature is a feature on an integrated circuit or other microdevice.

17. A method as recited in claim 11, wherein said scanning is conducted along two dimensions.

18. A method as recited in claim 17, wherein a plurality of features are detected by said observing, and additionally comprising displaying an image of the features detected.

19. A method as recited in claim 18, wherein said features are features of a biological specimen.

20. A microscope for detecting a microscopic feature, said microscope comprising:

(a) a phase shift zone for generating a dark spot in a light beam having a characteristic wavelength and transmitted through said phase shift zone; said phase shift zone comprising a plurality n of at least three steps; wherein:

(i) each of said steps has a characteristic optical thickness for transmitting photons of the characteristic wavelength;

(ii) said steps are arranged radially around a center point corresponding to the dark spot, with each said step occupying an angle equal to approximately 360°/n of a hypothetical circle centered on the center point; such that the first said step is adjacent to the second said step and to the nth said step, the second said step is adjacent to the first said step and to the third said step, and so forth, and the nth said step is adjacent to the (n−1)st said step and to the first said step;

(iii) the optical thickness of said steps varies such that, compared to the phase of light of the characteristic wavelength transmitted through the first said step, the phase of the same light transmitted through the mth said step is approximately (m−1)×360°/n greater, wherein $1 \leq m \leq n$;

(b) a first light source for generating a first light beam and transmitting the first light beam through said phase shift zone; so that said phase shift zone induces a phase change of approximately 180° in the photons of the first beam transmitted on opposite sides of the center point; whereby the intensity of the transmitted first beam contains a dark spot corresponding to the location of the center point;

(c) a scanner to scan the transmitted first beam with the dark spot across the feature;

(d) a detector to detect the intensity of light from the first beam thereby transmitted through or reflected by the feature;

(e) a second light source for generating a second light beam; wherein the intensity distribution of photons in the second beam is approximately the same as the intensity distribution of photons in the transmitted first beam, but without the dark spot of the transmitted first beam;

(f) a scanner to scan the second beam across the feature;

(g) a detector to detect the intensity of light from the second beam thereby transmitted through or reflected by the feature;

(h) a circuit to subtract the detected intensity of the first beam from the detected intensity of the second beam;

whereby the difference between the two intensities approximately equals the intensity that would have been detected from a hypothetical light beam whose width corresponded to the width of the dark spot in the transmitted first beam; and (i) an output device to output changes in the difference between the two intensities as the first and second beams are scanned across the feature, whereby changes in the difference are an indication of the presence and location of the feature.

21. A microscope as recited in claim 20, wherein each of said light sources generates a coherent laser beam.

22. A microscope as recited in claim 20, wherein each of said light sources is monochromatic.

23. A microscope as recited in claim 20, wherein each of said light sources is monochromatic and has the same wavelength.

24. A microscope as recited in claim 20, wherein each of said light sources generates light having wavelengths in the range from about 450 nm to about 650 nm.

25. A microscope as recited in claim 20, wherein said scanner is adapted to scan along two dimensions.

26. A microscope as recited in claim 25, wherein said output device displays an image of the features detected.

27. A microscope for detecting a microscopic feature, said microscope comprising:

(a) a phase shift plate comprising a step that induces a phase change of approximately 180° in photons that impinge on said phase shift plate on opposite sides of the step;

(b) a first light source for generating a first light beam and transmitting the first light beam through said phase shift plate; whereby the intensity of the transmitted first beam contains a dark line corresponding to the location of the step in said phase shift plate;

(c) a scanner to scan the transmitted first beam with the dark line across the feature, (d) a detector to detect the intensity of light from the first beam thereby transmitted through or reflected by the feature;

(e) a second light source for generating a second light beam; wherein the intensity distribution of photons in the second beam is approximately the same as the intensity distribution of photons in the transmitted first beam, but without the dark line of the transmitted first beam;

(f) a scanner to scan the second beam across the feature, (g) a detector to detect the intensity of light from the second beam thereby transmitted through or reflected by the feature;

(h) a circuit to subtract the detected intensity of the first beam from the detected intensity of the second beam; whereby the difference between the two intensities approximately equals the intensity that would have been detected from a hypothetical light beam whose width corresponded to the width of the dark line in the transmitted first beam; and (i) an output device to output changes in the difference between the two intensities as the first and second beams are scanned across the feature, whereby changes in the difference are an indication of the presence and location of the feature.

28. A microscope as recited in claim 27, wherein each of said light sources generates a coherent laser beam.

29. A microscope as recited in claim 27, wherein each of said light sources is monochromatic.

30. A microscope as recited in claim 27, wherein each of said light sources is monochromatic and has the same wavelength.

31. A microscope as recited in claim 27, wherein each of said light sources generates light having wavelengths in the range from about 450 nm to about 650 nm.

32. A microscope as recited in claim 27, wherein said scanner is adapted to scan along one dimension.

33. A microscope as recited in claim 27, wherein said scanner is adapted to scan along two dimensions.

34. A microscope as recited in claim 27, wherein said output device displays an image of the features detected.

* * * * *